United States Patent [19]

Sefton et al.

[11] 4,046,991

[45] Sept. 6, 1977

[54] POWER CONTROL APPARATUS

[75] Inventors: Philip Charles Sefton, London; Kenneth Ernest Chad, Bushey Heath, both of England

[73] Assignee: Thorn Domestic Appliances (Electrical) Limited, London, England

[21] Appl. No.: 509,787

[22] Filed: Sept. 27, 1974

[51] Int. Cl.² ............................................. H05B 1/02
[52] U.S. Cl. .................................... 219/497; 219/501
[58] Field of Search ............... 219/490, 494, 497, 499, 219/501; 307/238, 239; 323/101; 235/92 EA, 92 EV, 92 PE, 92 CT

[56] References Cited

U.S. PATENT DOCUMENTS

| | | | |
|---|---|---|---|
| 3,315,063 | 4/1967 | Ihlenfeldt | 219/497 |
| 3,371,191 | 2/1968 | Seney | 219/497 X |
| 3,523,182 | 8/1970 | Phillips et al. | 219/501 |
| 3,764,783 | 10/1973 | Terry et al. | 235/92 EV |
| 3,930,144 | 12/1975 | Tanaka | 235/92 EV |

*Primary Examiner*—Bruce A. Reynolds
*Assistant Examiner*—Fred E. Bell
*Attorney, Agent, or Firm*—Fleit & Jacobson

[57] ABSTRACT

A power control apparatus uses a digital electronic counter to gate a triac for controlling the current supplied to a load. The preferred arrangement is that each of 10 possible counts achievable by the counter corresponds to a particular rate of current supply to the load. The counter may be caused to count up or count down by means of proximity switches mounted on a control panel and optionally includes a reset input. The control panel comprises an insulating glass plate having three pairs of electrodes thereon with the electrodes of each pair being mounted on opposite faces of the plate, each pair of electrodes being associated with a respective one of the count-up, count-down and reset inputs of the counter, the pair associated with the reset input being shaped to surround in the respective plane of the plate the other two electrodes on that surface of the plate.

15 Claims, 4 Drawing Figures

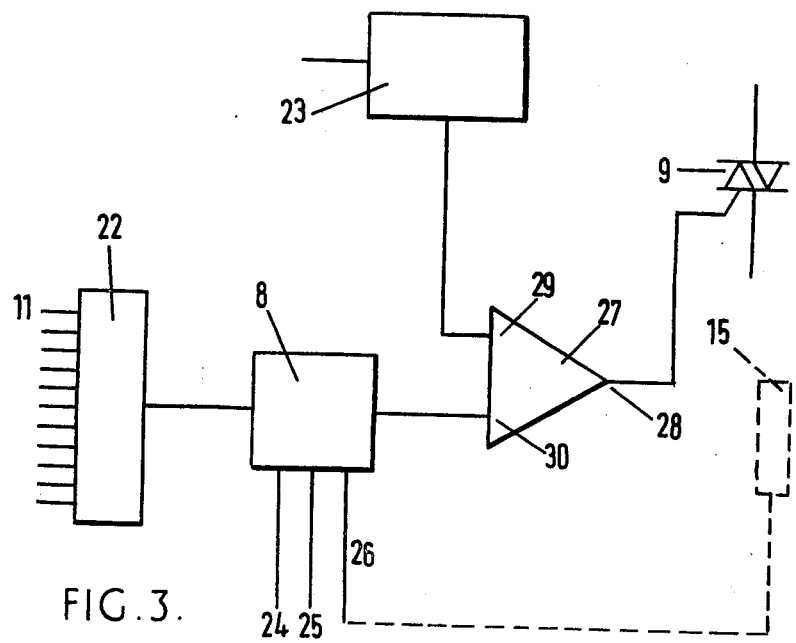
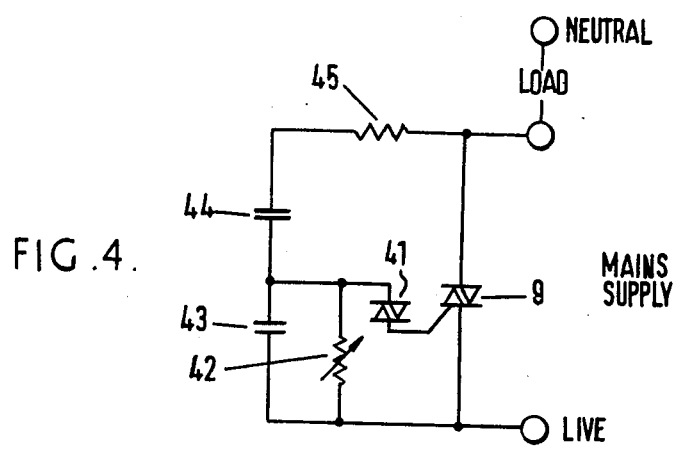

POWER CONTROL APPARATUS

The present invention relates to a power control apparatus.

Many devices are known which allow an operator to vary the power dissipated in a load. Such devices may include user-operable components such as simple switches, rheostats, bi-metallic strip thermostats and the like which may either directly vary the power dissipated in the load or vary the power by means of an intermediate electronic or electro-mechanical circuit. Such devices all have the common feature that they include at least one part which is movable by the operator and this feature gives rise to several problems; for instance, in the case of a control panel for an electric cooker, great care has to be taken when wiping round the control knobs when cleaning the cooker.

It has also been proposed to utilise proximity switches to vary the power dissipated in the load. For instance, the group of proximity switches may be provided, each of which is connected to a respective circuit which causes a predetermined amount of power to be dissipated in the load. Thus by operating the appropriate proximity switch it is possible to select which one of a predetermined number of power levels is dissipated in the load. This arrangement has been used to control the heating elements in a cooker, the proximity switch arrangement being used to replace the conventional bi-metallic regulator controls. However, in order to provide sufficiently fine variation in the power supplied to the heating element it has been necessary to provide 5 or 10 switches for each cooker hot-plate, thereby requiring something in the order of 40 proximity switches for the various hot-plates and grill of the cooker, with the attendant duplication of the proximity switch circuits.

According to a first aspect of the present invention there is provided a power control apparatus including a memory for storing a variable numerical value; means connected to an output of the memory for varying the rate of energy supply to a load in dependence on the value stored in the memory, so that each value corresponds to a respective rate of energy supply; manually operable means connected to a first control input for the memory for causing the memory to increase the value stored and manually operable means connected to a second control input for the memory for causing the memory to decrease the value stored.

The memory may operate in either an analogue or digital fashion. In the former case, the values stored may be represented for instance, as the voltage existing across the plates of a capacitor, in which case the voltage may be changed, and hence the value stored, by means of a diode pump arrangement. This arrangement allows the value stored by the memory to be continuously variable over a range of values.

By a digital arrangement there is meant one in which the memory can hold any one of a number of discrete values. Suitably such a digital memory stores the value as a group of binary encoded digits. In this case the memory may include any known means for storing such binary digits, such as, a shift register, a series of binary latches or a binary counter.

In a preferred embodiment of a first aspect of the invention, which may be used to control the heating element of an electric cooker, the memory includes a digital counter which may be made to count up between a plurality of discrete counts, there suitably being 10 possible counts in all.

The counter may be driven by pulses which are spaced at approximately 0.2 or 0.5 second intervals. These pulses may be derived from the fifty hertz mains supply. The outputs from the counter may be connected to a numerical display which indicates the count stored.

Preferably the counter has a clock input, a "count-up" input, a "count-down" input and a "reset" input. Suitably the counter counts pulses applied to the clock input when either the count-up or count-down inputs are operated. When the count-up input is operated, the pulses applied to the clock input are counted upwards by the counter so that the count achieved by the counter is thereby increased. Similarly when the count-down input is operated the counter counts downwards, the pulses applied to the clock input serve to decrease the count stored by the counter. The reset input is suitably operable to reset the counter to its lowest counting value which preferably corresponds to a zero energy supply rate to the load.

Preferably the counter input, count-down input and reset input are each connected to a respective proximity detector via respective switching circuits. Suitably the arrangement is such that the presence of an operator's finger in contact with or closely spaced from one of the proximity detectors causes the respective input to the counter to be activated. These proximity detectors may be mounted on a control panel.

The counter used may be of the recycling type, in which case, gating circuits may be provided to prevent the counter counting up beyond its maximum count or down below its minimum count.

In the preferred embodiment of the invention the load is an electrically heated element of an electric cooker hob, which is supplied with electric current from the alternating mains supply via a triac whose gate is connected by a suitable circuit to the output of the counter, this circuit serving to gate the triac so that the power dissipated in the heating element is varied in proportion to the count stored by the counter. The triac is preferably operated in the known "burst fire" mode in which the triac delivers a proportion of complete half-cycles of the mains supply to the heating element, this proportion varying dependent on the count stored by the counter. In the "burst fire" mode the triac only switches on and off as the alternating mains supply voltage instantaneously crosses zero, so that the problems of introducing interference into the mains supply which occurs in the known "phase-control" mode is avoided.

The output from the counter may be used to gate the triac in a number of ways. For instance, the count may be converted into a corresponding voltage, resistance or current by means of known resistive ladder networks. Such a corresponding voltage, resistance or current may then be used as a parameter in a further circuit which varies the mark-to-space ratio of the complete half-cycles of the current supplied to the load by the triac.

Alternatively, the count stored by the counter may be used to burst fire the triac by means of a purely digital network. In this case there may be provided a read-only memory which suitably stores a number of binary "words". Thus when the counter stores a particular count a gating circuit causes a corresponding word to be read from the read-only memory, this word being used to determine the mark-to-space ratio of the complete half-cycles of the current delivered by the triac.

Suitably the particular word would be read serially, that is, one bit at a time, and each bit would represent whether the triac were to be gated on or off during the period in which that bit was being read. The operation of the triac in the burst fire mode could be effected simply by making sure that each bit of the word being read is read for a period which is a multiple of the time period of half a cycle of the main supply. A purely digital arrangement such as this would eliminate the thermal drift and other errors which could occur in either a completely analogue system or a part-analogue part-digital system.

In order to operate the heating element of a cooker provided with such a control circuit, an operator notes the indicated count and decides whether the corresponding rate of heating of the heater element needs to be increased or decreased. If the operator decides that the rate of heating needs to be increased he places a finger on the "count-up" proximity detector and the counter then proceeds to count upwards, at the same time increasing the flow of current to the heating element via the triac, the count at all stages being indicated by the display. When the operator decides that a sufficient rate of heating has been achieved, he then removes his finger from the "count-up" proximity detector and the counter remains at this count. The triac then continues to regulate the supply of electricity to the heating element at a substantially constant rate.

Similarly, if the operator decides that the rate of heating is to be reduced he places his finger on the "count-down" proximity detector which causes the counter to count downwards and when the display indicates that a desired count corresponding to a desired rate of heating has been achieved, the operator removes his finger from the "count-down" proximity detector whereupon the counter holds its count at this point.

Operation of the "reset" proximity detector causes the counter to return to a count of zero, thereby shutting off the supply to the heating element.

The relationship between the count achieved by the counter and the current supplied to the heating element via the triac is not necessarily linear and indeed may be made logarithmic to provide facilities for simmering and boiling.

According to a second aspect of the invention there is provided a proximity detector including an insulated plate member, a first sense electrode on one face of the insulating plate and a second sense electrode on the opposite face of the insulating plate, the first sense electrode being capacitively coupled with the second sense electrode and the first sense electrode being responsive either to contact between the second sense electrode and the conducting body or to close proximity between the second sense electrode and conducting body to produce an output signal, only the first sense electrode having an output connection.

Preferably the insulating member is a glass sheet. In a preferred embodiment of this aspect of the invention three such sets of electrodes are provided on a single glass plate and the first electrode of each set is connected to a respective electric circuit which can detect a flow of current to and/or from the first electrode. The output from the first electric circuit may be connected to the "count-up" input of the control circuit described above, the second electric circuit output to the "count-down" input and the third output to the "re-set" input.

The provision of the second electrode represents an improvement over known proximity detectors in that when a finger or other body is applied to the second electrode the capacitance coupling between the first and second electrodes is independent of the shape or size of the finger or the manner in it is applied to the second electrode.

According to a further aspect of the present invention there is provided a control panel including an insulating plate, a first sense electrode on one face of the plate, a second sense electrode on the said face of the plate, the second electrode being shaped to surround in the plane of said face at least the greater part of the first electrode whilst being spaced therefrom, and third and fourth electrodes corresponding approximately in shape to the first and second electrodes respectively and being on the opposite face of the plate of the four electrodes, only the third and fourth electrodes having a respective output connection.

Preferably the fourth electrode is connected via a suitable electric circuit to the reset input of the counter described above.

Advantageously an additional pair of electrodes, similar to the first and the third electrodes respectively are provided.

Thus when the panel on which the proximity switches are mounted is cleaned, for instance by wiping with a cleaning cloth, the provision of the surrounding electrode ensures that the counter is reset to zero i.e. corresponding to no heat being supplied from the heating element so that the element will not inadvertently be switched on during cleaning.

In order that the invention will more clearly be understood, the following description is given, merely by way of example, reference being made to the accompanying drawings, in which:

FIG. 3 is a block schematic diagram of a burst fire controller for a power control apparatus according to the invention and FIG. 4 is a circuit for an alternative form of burst fire controller.

FIG. 1 shows in block form a preferred embodiment of control apparatus according to the invention.

An electronic counter 1 has ten output lines generally designated 11, each output line carrying an output signal when a corresponding count is achieved, and three control inputs 12, 13 and 14, these inputs causing the counter to count-up, count-down and reset to zero respectively. The counter 1 may be of a conventional recycling type in which case logic circuits are provided which prevent it from counting up beyond a count of nine and counting down beyond a count of zero.

Figure 1:
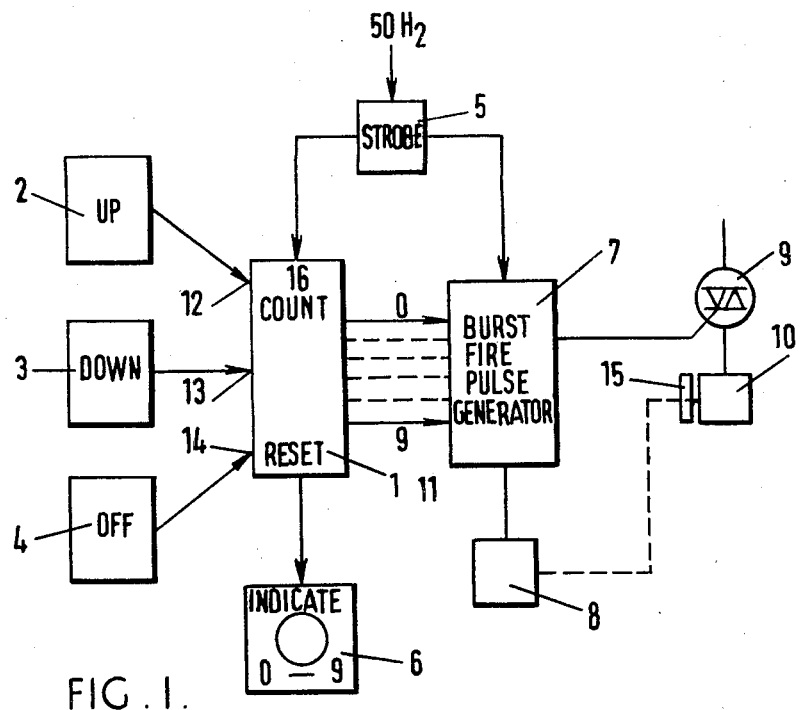
FIG. 1 is a block schematic diagram of a power control apparatus in accordance with the invention for use with an electric cooker heating element.

A display 6 is connected to the outputs of counter 1 via a suitable driving circuit (not shown). Although display 6 is shown in FIG. 1 as being connected to a separate output, the display 6 could of course be connected to lines 11. Any suitable device may be used as display 6 although a seven segment display of the L.E.D. or liquid crystal type is preferred.

The inputs 12, 13 and 14 of counter 1 are driven by the outputs of proximity switches 2, 3 and 4 respectively and each proximity switch is arranged so that it produces an output only when its operating surface is touched by an operator. Counter 1 is arranged so that it will retain a fixed count until one of the control inputs 12, 13 and 14 is operated.

Each of the proximity switches, 2, 3 and 4 includes a respective proximity detector and associated switch circuit. The switch circuits may be of any of the known types which are adapted to produce an output signal in response to the presence of an object such as an operator's finger in close proximity with or in contact with the associated proximity detector. For instance, each proximity detector output electrode may be connected to the gate MOS field effect transistor and the source or drain circuit of the transistor may include a load resistor so that an output signal may be developed across the drain and source of the transistor.

A strobe 5 is provided which delivers to the clock input 16 of counter 1 pulses which preferably occur at approximately 0.2 or 0.5 second intervals. The strobe 5 may consist of a digital dividing network driven by pulses derived from the 50 hertz electrical mains supply.

The pulses delivered to the clock input 16 of counter 1 are the pulses which are effectively counted when either of its inputs 12 or 13 is operated.

Each output line 11 is connected to a respective input of a burst fire controller 7, whose output is connected to the gate of a triac 9, which in turn controls the flow of electric current to a heating element or elements 10 which may be included in a cooker hot-plate.

Triac 9 is operated in the "burst fire" mode. That is to say that it is operated to supply pulses consisting of a whole number of supply cycles of mains alternating current to the heating element. By varying the mark to space ratio of the pulses, the width of the pulses and thereby the rate of energy supply to the heating element 10 can be varied as desired. For example, a long pulse or mark separated by a short space will have the effect of supplying a relatively large amount of energy to the heating element per unit time whereas a short pulse or mark and a long space will cause a relatively small amount of energy per unit time to be supplied to the heating elements 10.

FIG. 3 shows a preferred form of burst fire controller 7 in accordance with the invention. A digital to analogue converter 22 produces a DC output voltage which is proportional to the count input carried by lines 11. Preferably the higher the count registered by counter 1, the higher the DC voltage output of converter 22. This DC output voltage is applied to the input of a delay switch 8 whose output is in turn connected to one input of a comparator 27. A free running ramp generator 23 is provided, the ramp output of which may have a time constant of approximately 20 seconds so that the effect of switching of the heater current on the mains supply may be minimised.

Comparator 27 is arranged so that triac 9 is only gated-on when the ramp voltage from generator 23 applied to input 29 is less than the voltage applied to the input 30 from delay switch 8.

Assuming that a steady DC voltage is applied to input 30 of comparator 27, output 28 of comparator 27 will gate-on triac 9 until the ramp voltage from ramp generator 23 exceeds the input voltage to input 30. When the ramp voltage has exceeded the input voltage to input 30, output 28 stops producing an electrical output signal, but because of the nature of operation of triac 9 it will continue to conduct until the alternating mains supply waveform passes through zero at which time triac 9 will cease to conduct. Thus since the time taken for the ramp voltage to exceed the input voltage to input 30 will be proportional to the magnitude of the input voltage, the proportion of time during which triac 9 supplies current to heating element 10 will be dependent on the voltage applied to input 30. The ramp voltage from ramp generator 23 will continue to increase thus inhibiting gating-on of triac 9 until a new ramp generation cycle commences whereupon its output is reduced to zero.

Hence triac 9 is only turned on or off when the alternating mains supply is instantaneously zero, thereby eliminating the possibility of causing high-frequency transients which may cause interference with other appliances.

Switch 8 is arranged so that when counter 1 is holding a steady count the output from delay switch 8 is proportional to the input voltage from converter 22. However, if the "count-up" proximity switch 2 is operated it delivers a pulse to input 24 of switch 8 which causes delay switch 8 to produce an output voltage which corresponds to the maximum heating rate from heating element 10. A thermal sensor 15, e.g. an infra-red sensor may be provided located adjacent the heating element 10. Thermal sensor 15 produces an output signal which is proportional to the temperature measured and which may be fed to an input 26 of delay switch 8. When a predetermined temperature is registered by sensor 15, delay switch 8 returns to producing an output which is proportional to the input from converter 22. Thus control of the current supplied to the heating element 10 is returned to converter 22.

Delay switch 8 also includes a further input 25 which is arranged to be activated when the count-down proximity switch 3 is operated. Delay switch 8 is then caused to produce zero output voltage until a second predetermined temperature is registered by temperature sensor 15.

Therefore when it is desired to increase the rate of heating from heating element 10, the appropriate proximity switch is operated and in the case where the heating rate is desired to be increased the heating element 10 is supplied with maximum current for a period, the supply current then reducing to that corresponding to the desired heating rate. This arrangement permits fast response of the heating element 10 to desired change in heating rate. Similarly, operation of the count-down proximity detector inhibits the supply of current to heating element 10 for a time therefore increasing the speed of response of the element 10 to a reduced rate of heating.

Alternatively, instead of a thermal sensor 15, switch 8 may be provided with a time delay circuit, whose time delay cycle is initiated when either of the inputs 24 or 25 are activated on operation of the respective proximity switch and during the delay time, delay switch 8 operates as described above. When the delay cycle of the time delay circuit is complete, control of input 30 of comparator 27 is returned to converter 22, thus providing a similar function to the provision of thermal sensor 15. However, since the time required to reach a desired temperature, and the maximum temperature attained for a particular rate of current supply to heating element 10 will depend on the thermal capacity of whatever body is being heated, the desired time delay, or temperature to be sensed by sensor 15 must be chosen to be optimum for the average conditions of use of heating element 10.

The converter 22 included in burst fire controller 7 need not necessarily have a linear transfer characteristic between the count delivered to the input of the converter and the output delivered to the burst fire pulse generator. Indeed it is preferred that the transfer relationship conforms to a substantially logarithmic relationship so that a change of count for instance from 1 to 2 produces a much smaller change in the rate of energy supply to heating element 10 than does a change in count from, for instance, 7 to 8. With such a transfer characteristic it is possible to provide relatively fine adjustment of heating rate at low heats to facilitate simmering.

The outputs from counter 1 to the burst fire controller 7 and indicator 6 may either each consist of 10 separate lines, each line carrying a signal when a corresponding count is achieved or, for instance, four lines may be used and the count encoded as a four bit binary code in which case decoding circuits may be provided in burst fire controller 7 and display 6 respectively to produce outputs corresponding to the 10 possible counts.

The control apparatus described above is adapted for regulating the supply of alternating current to a load via a triac 9. However, a similar circuit may be used for controlling a direct current power supply. This may be achieved by connecting the output of converter 22 to the regulating input of a direct current regulator, for instance, to the base of a power transistor which is connected in series with a load.

The preferred embodiment of control apparatus described above operates so as to count the pulses applied to the clock input 16 of the counter 1. An alternative arrangement exists whereby the count input 16 of counter 1 may be connected to both of the count-up proximity switch 2 and the count-down proximity switch 3. With this arrangement the counter counts up or counts down by one count each time the appropriate proximity switch is touched. Thus it is possible in this arrangement, to make the counter count up, for example, three counts by touching the up proximity switch three times.

Figure 2:
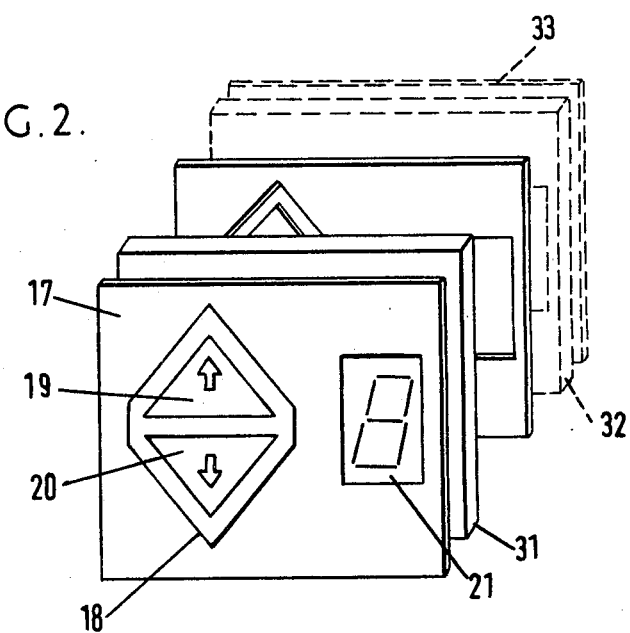
FIG. 2 is an exploded front elevation of a control panel in accordance with the invention incorporating proximity detectors in accordance with the invention.

FIG. 2 shows a control panel incorporating proximity detectors in accordance with the invention. The panel consists of metallic elements 17, 19 and 20 as shown mounted on a glass plate 31, the metallic elements 17, 19 and 20 being separated from one another by a zone 18. Corresponding metallic layers 17a, 19a and 20a respectively are located in alignment on the opposite face of glass plate 31. Each of the metallic elements 17a, 19a and 20a is connected to a respective electrical switch circuit which can detect the flow of current to and/or from the element. The elements 17, 19 and 20 are insulated by a thin coat of non-conducting lacquering over their whole surface and from elements 17a, 19a and 20a by the glass plate 31. Preferably the lacquer is a glass-like or ceramic material.

When an operator places a finger on any one of the elements 17, 19 or 20, the corresponding element 17a, 19a or 20a is capacitively coupled to earth by virtue of the dielectric properties of glass plate 31, since the operator's body will generally be at approximately earth potential and his electrical resistance will be much less than the glass plate 31.

The proximity detector circuits associated with each element 17a, 19a and 20a are adapted to produce an output signal whenever the corresponding element 17, 19 or 20 is touched by an operator. Preferably the proximity detector circuit associated with elements 17a, 19a and 20a are connected to the "reset" 14, "count-up" 12 and "count-down" input 13, respectively of counter 1.

Preferably all the circuit elements shown in FIGS. 1 and 3 except triac 9 and heating element 10 are powered from a low voltage direct current source and their zero volt rails are connected to the live side of the mains supply.

In this arrangement, when an operator places his finger on one of the elements 17, 19 or 20, the electrode touched is effectively coupled to earth and causes a capacitive charging current to flow to or from the corresponding element 17a, 19a or 20a since these elements are connected to switches whose zero volt rails are connected to the live side of the mains and thus all of the elements 17a, 19a and 20a are maintained at an alternating voltage of the order of the mains supply voltage above earth. A respective switch senses the capacity charging current which is thus caused to flow and produces an output signal. Since elements 17, 19 and 20 are electrically conductive, the capacitive coupling between each element and its corresponding element 17a, 19a or 20a is rendered independent of the size or shape of the operator's finger and the manner in which it is applied to the electrode.

A further advantage of the arrangement shown in FIG. 2 is that if the front panel constituted by elements 17, 19 and 20 and display 6 is cleaned by, for instance, wiping a cloth, the last element which will be touched by the cloth will be element 17 and this will cause its associated switch to deliver an output signal to the reset input 14 of counter 1 thus turning off the electrical supply to the heating element 10. Thus there is no danger of the cooker being inadvertently switched on by operation of element 19 since such an operation will always be followed during cleaning by the operation of the switch associated with element 17.

In order to prevent stray fields behind elements 17a, 19a and 20a from operating their associated switches a further sheet of dielectric material 32 may be located behind elements 17a, 19a and 20a and behind this a further sheet of conductive material 33 which may for instance be connected to the zero volt rail supplying the control elements.

Sheet 33 will effectively form a screen to prevent operation of any of the proximity detectors by stray fields from behind.

Preferably display 6 is located behind the glass sheet 31 to faciliate connection to its driving circuits and also to protect it from damage.

Although it is not shown in the Figures a pulse transformer may be used to couple burst fire controller 7 to the gate of triac 9. Whilst not essential this will ensure that there is no danger to either the operator or the control elements should breakdown of triac 9 occur. The operator is further protected in that the only portions of the apparatus accessible under normal circumstances are elements 17, 19 and 20 and these are electrically insulated from all the other circuit elements.

The various circuit elements described may be constructed using one or more integrated circuits. Preferably, all the circuit elements are included in a single metal oxide semi-conductor integrated circuit.

Although the embodiments of control apparatus described are adapted for use with an electrical heating element, the apparatus may be modified to operate with a gas burner, for instance, by the use of an electromechanical control valve.

Various other circuits exist for implementing the power control apparatus of the invention. For instance, the counter 1 may be replaced by a shift register consisting of a number of bi-stables arranged in known fashion and this register may suitably carry a pattern of binary digits. In this case the count-up and count-down inputs may be used to shift the binary pattern in either direction through the register. Outputs of the register may be decoded to produce an output equivalent to the count of counter 1. Such a decoder may include switching circuits which switch into circuit a respective resistor of differing value for each decoded output in known fashion.

FIG. 4 shows an alternative form of burst fire controller which includes triac 9 whose gate is driven through a diac 41. In this case the triac 9 is controlled by the disc discharge from capacitor 43. Capacitor 42 is fed via a protection resistor 45 and a capacitor 44, capacitor 44 serving to provide maximum current drive at the instantaneous zero crossings of the supply voltage. This circuit may provide a proportion of complete half cycles of the mains supply, which proportion may vary between 0 and 100%. The precise proportion is determined by a variable resistance represented in FIG. 4 by a variable resistance 42. This variable resistance 42 may be a variable resistance generated from either the output of converter 22 or from the decoder of the shift register arrangement described above. However, since the current flowing through the resistor 42 will alternate in direction, it would be necessary to couple either the convertor 22 or the decoder output into the circuit of FIG. 4 via a four-diode bridge, the output from the decoder or convertor being connected to two opposite arms of the bridge and the other two arms of the bridge being connected to respective leads of capacitor 43. Suitable values for the components shown in FIG. 2 are resistance 42, variable between 0 and 50K, resistor 45,100K, capacitor 43, 0.02$\mu$F, capacitor 44 0.02$\mu$F, diac type D32 and triac type Q 400614.

As mentioned earlier the memory could alternatively be an analogure memory. For instance, the value of count to be stored could be represented by a voltage existing across the plates of a capacitor. This capacitor could be charged up or down by use of a known diode-pump arrangement adapted to increase or decrease the voltage across the capacitor. This diode pump arrangement could be connected via switch circuits to the output electrodes of proximity detectors such as those described, there being one proximity detector to increase the voltage across the capacitor and another proximity detector to decrease the voltage across the capacitor. The voltage existing across the capacitor could be monitored by very high impedance circuit such as that provided by the gate to drain circuit of a field effect transistor which would produce an output voltage or current in its source to drain circuit proportional to the voltage across the capacitor. Alternatively, the field effect transistor could be used to provide a variable resistance between its source and drain. This variable resistance could be used as the variable resistance 42 in FIG. 4 to achieve burst fire control of triac 9 or alternatively could be used as a variable resistor in any of the known phase control circuits. Alternatively the output of the analogue memory could be used to effect the variation in the mark to space ratio by an oscillator which could be used to gate, for instance, a triac. If an AC supply is used then neither the mark nor space of the oscillations should be shorter than half a cycle of the supply.

Although the triac 9 has been described as operating in the burst fire mode, there is no reason why it should not be operated in the known phase control mode when the problem of injection of interference into the mains supply is not important. If operated in the phase control mode, the triac could be associated with a suitable high frequency interference suppression network of any known type.

The embodiment of control apparatus of FIG. 1 has as its load an electrical heating element of an electric cooker. This is in no way limitative and the control apparatus could also be used for instance for controlling other heating elements, lighting arrangement or motors of various kinds. Also the display used could comprise nixie tubes, neon bulbs, tungsten lamps, or any other suitable form of display.

The outputs of the digital memories described could also be used to drive one or more electromagnetic relays to vary the power supplied to a load.

We claim:

1. In an electric cooker, a power control apparatus including; a memory for storing a variable numerical value, the memory having an output, a first control input for causing the values stored in the memory to be increased progressively while such first control input is actuated, and a second control input for causing the value stored in the memory to be decreased progressively while such second control input is actuated; first and second manually operable means for actuating said first and second control inputs respectively; an electric cooker heating element; and means connected to the output of the memory for varying the current supplied to the heating element in dependence on the value stored in the memory, so that each value corresponds to a particular rate of current supply to the load.

2. A power control apparatus as claimed in claim 1, wherein the memory is a digital memory for storing any one of a set of discrete numerical values.

3. A power control apparatus as claimed in claim 2, wherein the memory consists of an electronic counter, operable to count between discrete count values.

4. A power control apparatus as claimed in claim 3, and further comprising an input for the counter for pulses to be counted and a pulse generator, wherein the first control input is operable to cause the counter to count said pulses so that the count stored is increased, and the second control input is operable to cause the counter to count said pulses so that the count stored is thereby decreased and wherein the counter only counts said pulses when one of the control inputs is operated.

5. A power control apparatus as claimed in claim 4, wherein the pulse generator comprises a digital dividing network for deriving the pulses to be applied to the counter from an alternating current mains supply.

6. A control apparatus as claimed in claim 1 and further comprising an alternating mains supply; a triac connected in series with said heating element across said alternating mains supply; and a circuit having an input connected to the output of the memory, and an output for sending pulses to the triac, so that the triac is gated on for a proportion of complete half-cycles of the main supply, the said proportion varying according to the value stored by the memory.

7. A control apparatus as claimed in claim 1 wherein the relationship between the value stored by the memory and the rate of energy supplied to the heating element is substantially logarithmic.

8. A control apparatus as claimed in claim 1 and further comprising an overriding device for the current supply rate varying means operable so that for a period after the value stored by the memory is increased, the rate of current supply is increased to maximum and so that for a period after the value stored by the memory is decreased, the current supply rate is decreased to zero.

9. A control apparatus as claimed in claim 8, wherein said overriding device includes a time delay circuit for determining said periods.

10. A power control apparatus as claimed in claim 8, further comprising temperature sensing means operable to end either of said periods when a respective predetermined temperature is reached.

11. A power control apparatus as claimed in claim 1 and further comprising a numerical display for giving a visual indication of the value stored by the memory.

12. A power control apparatus as claimed in claim 1 and further comprising a reset control input of the memory, for causing the memory to store a value corresponding to a zero rate of current supply to the heating element and including third manually operable means connected to said reset control input.

13. A power control apparatus according to claim 1, wherein each of said manually operable means includes a respective switch circuit having an output connected to a respective control input of the memory and an input and a respective proximity detector electrode for each control input, each said electrode being connected to the input of a respective switch circuit.

14. A power control apparatus including a memory for storing a variable numerical value; the memory having an output, a first control input for causing the memory to increase the value stored, and a second control input for the memory for causing the memory to decrease the value stored; first and second manually operable means for actuating said first and second control inputs respectively; and means connected to the output of the memory for varying the rate of energy supply to a load in dependence on the value stored in the memory, so that each value corresponds to a respective rate of energy supply, a reset control input of the memory, for causing the memory to store a value corresponding to a zero rate of energy supply to the load and including third manually operable means connected to said reset control input, each of the manually operable means including a respective switch circuit having an output connected to a respective control input of the memory and an input and a respective proximity detector electrode for each control input, each said electrode being connected to the input of a respective switch circuit, three pairs of first and second electrodes mounted on an insulating plate member, with each of the first electrodes being mounted on the same face of the plate member, the output connection of each of the first electrodes being connected to the input of a respective switch circuit.

15. A power control apparatus including a memory for storing a variable numerical value; the memory having an output, a first control input for causing the memory to increase the value stored, and a second control input for the memory for causing the memory to decrease the value stored; first and second manually operable means for actuating said first and second control inputs respectively; and means connected to the output of the memory for varying the rate of energy supply to a load in dependence on the value stored in the memory, so that each value corresponds to a respective rate of energy supply; at least two proximity detectors each including an insulated plate member, a first sense electrode on one face of the insulating plate and a second sense electrode on the opposite face of the insulating plate, the first sense electrode being capacitively coupled with the second sense electrode and the first sense electrode being responsive to close proximity between the second sense electrode and conducting body effective to produce an ouput signal, only the first sense electrode having an output connection each electrode output connection being connected to the input of a respective switch circuit whose output is in turn connected to a respective control input of the memory.

* * * * *